(12) United States Patent
Heisen et al.

(10) Patent No.: US 8,166,642 B2
(45) Date of Patent: May 1, 2012

(54) STRIPLINE FLEX CIRCUIT

(75) Inventors: Peter T. Heisen, Kent, WA (US); Scott A. Raby, Redmond, WA (US)

(73) Assignee: The Boeing Company, Chicago, IL (US)

( * ) Notice: Subject to any disclaimer, the term of this patent is extended or adjusted under 35 U.S.C. 154(b) by 144 days.

(21) Appl. No.: 12/612,817

(22) Filed: Nov. 5, 2009

(65) Prior Publication Data

US 2010/0043223 A1 Feb. 25, 2010

Related U.S. Application Data

(62) Division of application No. 11/558,615, filed on Nov. 10, 2006, now Pat. No. 7,629,538.

(51) Int. Cl.
*H05K 3/36* (2006.01)
*H05K 3/30* (2006.01)
(52) U.S. Cl. .......................................... 29/830; 29/835
(58) Field of Classification Search .................. 29/830, 29/831, 835; 174/254
See application file for complete search history.

(56) References Cited

U.S. PATENT DOCUMENTS

| | | | |
|---|---|---|---|
| 4,977,215 A | 12/1990 | Gardner et al. | |
| 5,428,190 A * | 6/1995 | Stopperan | 174/261 |
| 5,828,555 A | 10/1998 | Itoh | |
| 5,918,113 A | 6/1999 | Higashi et al. | |
| 6,060,882 A | 5/2000 | Doty | |
| 6,424,313 B1 | 7/2002 | Navarro et al. | |
| 6,670,930 B2 | 12/2003 | Navarro | |
| 6,989,791 B2 | 1/2006 | Navarro et al. | |
| 7,119,285 B2 | 10/2006 | Kim et al. | |
| 7,361,848 B2 | 4/2008 | Happoya | |
| 7,423,219 B2 | 9/2008 | Kawaguchi et al. | |
| 2002/0076919 A1 | 6/2002 | Peters et al. | |
| 2004/0178496 A1 | 9/2004 | Rapport et al. | |
| 2007/0172987 A1 | 7/2007 | Dugas et al. | |

* cited by examiner

*Primary Examiner* — Jeremy Norris
(74) *Attorney, Agent, or Firm* — Yee & Associates, P.C.

(57) ABSTRACT

The invention removes copper from the concave side of a flex circuit around a bendable region and replaces it with a conductive epoxy to allow it to be formed to tighter bend radii than would otherwise be possible. After the flex circuit is shaped in a tight radius and attached to a mechanical structure, the conductive epoxy is cured to act as functional replacement of the removed copper.

4 Claims, 7 Drawing Sheets

PRIOR ART

STRIPLINE FLEX CIRCUIT

This is a divisional application of application Ser. No. 11/558,615, filed Nov. 10, 2006, now U.S. Pat. No. 7,629,538.

FEDERALLY SPONSORED RESEARCH OR DEVELOPMENT

This invention was made under a contract with the government of the United States of America under contract N00014-02-C-0068 and with government support. The government has certain rights in this invention.

BACKGROUND

1. Field of the Invention

This invention is directed to flexible printed circuit boards, and particularly, to a device and method for a flexible printed circuit board incorporating stripline or microstrip transmission lines that pass through a small radius bend.

2. Related Art

Flexible printed circuit boards or "flex" circuits are used in a wide variety of applications, where an electrical circuit must bend around corners or be flexed during operation. Typically, flex circuits are thin, light weight, flexible, and exhibit high routability. Generally, a flex circuit may be used as an interconnecting medium in a phased array architecture. In some cases, particularly when microwave signals are present, design considerations mandate that the flex circuit is a stripline construction of certain minimum thickness; which typically consists of a central trace sandwiched between two ground planes, which are spaced a certain distance apart. Two interposing low-loss dielectric material layers are used as insulators. Alternately, the flex circuit may feature a microstrip construction; which typically includes a trace and a single ground plane, spaced a specific distance apart, with a low-loss dielectric material as an insulating interposer.

Generally, there is a minimum bend radius to which flex circuits may be formed without damaging the flex circuit. The minimum bend radius is a function of several aspects of the flex circuit geometry and the materials used, but the distance between the outermost metal layers of the flex circuit is a key parameter limiting the minimum bend radius.

Many flex circuits have only one metal layer, or the distance between the outermost metal layers is minimized, so that the minimum allowable bend radius may also be minimized. Unfortunately, in some cases the distance between the outermost metal layers cannot be decreased below a particular value due to electrical design considerations or manufacturing limitations. This is often the case with flex circuits that incorporate a stripline or microstrip construction.

When a flex circuit having two or more metal layers is formed to a bend radius that is less than allowable minimum, the external copper layers of the circuit tend to crack or buckle. Internal delamination has also been observed. In some cases concerning a flex circuit with a stripline construction, one or more central traces have broken, resulting in open circuits. This results in low manufacturing yields, and raises serious long-term reliability concerns. Typically, the copper ground plane on the convex side of the flex circuit cracks while the copper ground plane on the concave side buckles. When no cracking occurs, it is often because internal delamination has provided strain relief, sufficient to prevent cracking, but such delamination leads to additional reliability problems.

What is needed is a structure and method that allow bending of the flex circuit around a small radius while preserving both the mechanical and electrical integrity of the design.

SUMMARY

The invention provides a device and method for forming a flexible printed circuit board to a smaller bend radius than would otherwise be possible without damaging the circuit. This is done by removing copper from the concave side of the flex circuit in the bend region and replacing it with conductive epoxy in an uncured or semi-cured state. After the flex circuit is formed into a small radius bend, the conductive epoxy is cured to act as a functional replacement of the removed copper.

In one aspect of the invention, a method is provided for forming a conformable circuit element. The method includes depositing a conductive layer on a first side of a flex circuit; etching the conductive layer to form an etched region; depositing a conductive epoxy on the etched region; bending the flex circuit along a bending axis to form a concave surface on the first side; and curing the conductive epoxy.

In another aspect of the present invention, a flexible circuit is provided including at least an outside metal layer and an inside metal layer. A first dielectric layer is interposed between the outside metal layer and the inside metal layer. The inside metal layer includes an etched-out area. A layer of conductive epoxy is deposited on the inside metal layer having the etched-out area.

This brief summary has been provided so that the nature of the invention may be understood quickly. A more complete understanding of the invention may be obtained by reference to the following detailed description of embodiments thereof in connection with the attached drawings.

BRIEF DESCRIPTION OF THE DRAWINGS

The foregoing features and other features of the present invention will now be described with reference to the drawings. In the drawings, the same components have the same reference numerals. The illustrated embodiment is intended to illustrate, but not to limit the invention. The drawings include the following Figures.

DETAILED DESCRIPTION

Figure 1:
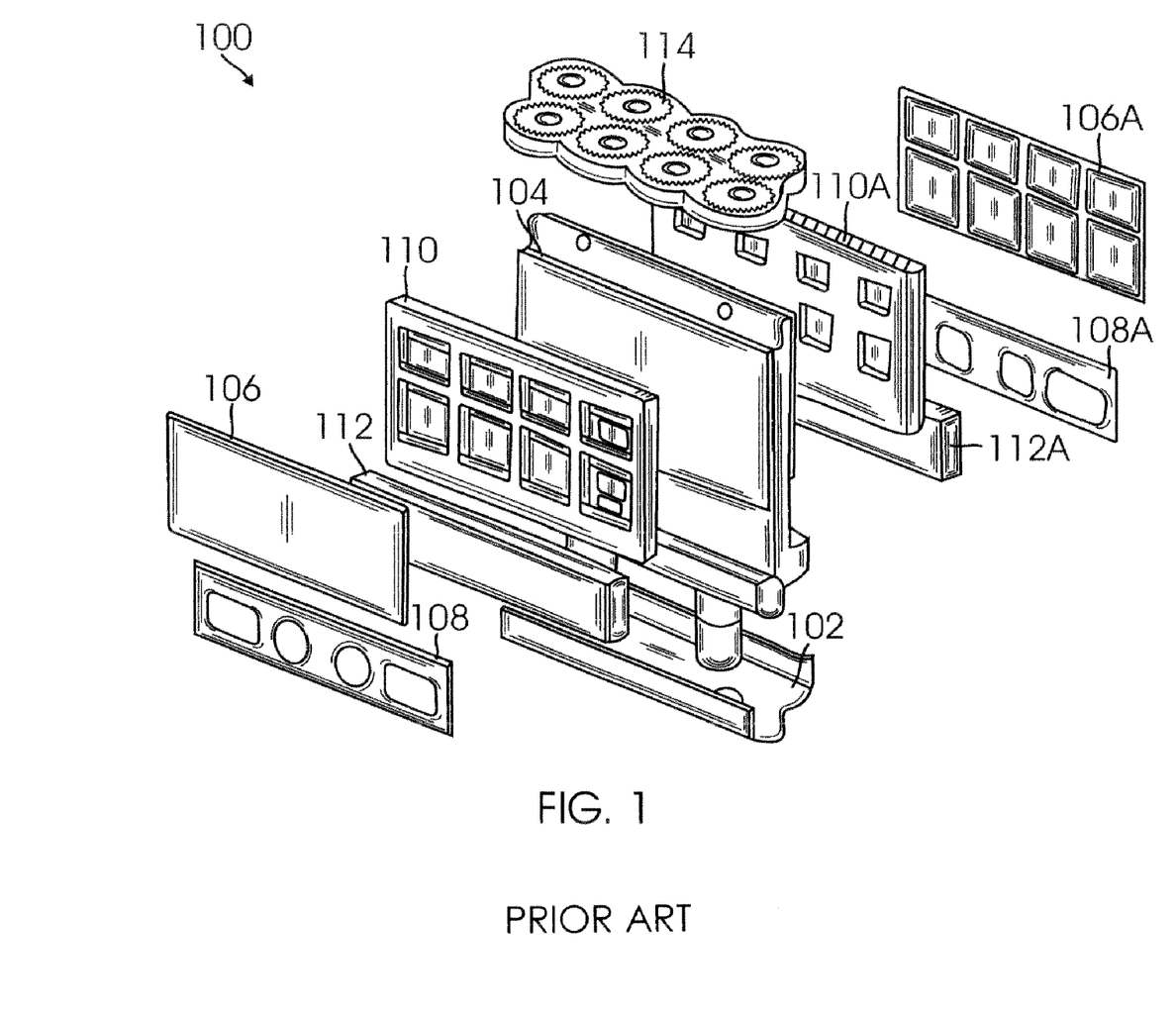
FIG. 1 illustrates a three dimensional packaging architecture for a Phased Array Antenna Element, in which a flexible printed circuit is typically used.

As shown in FIG. 1, a multi-chip, three-dimensional packaging architecture 100 (hereinafter "module 100"), includes a pair of chip carries 110 and 110A mechanically attached to a mandrel 104. Electrically and mechanically coupled to the chip carries 110 and 110A are bridge PWBs 112 and 112A, respectively. A bent flex circuit 102 provides electrical connection to bridge PWBs 112 and 112A. Guard shims 108 and 108A are attached between chip carriers 110 and 110A and bridge PWBs 112 and 112A, respectively, and lids 106 and 106A are used to cover the exposed surface of chip carriers 110 and 110A. An aperture integrated wiring board (AIPWB) 114 is attached to mandrel 104 and electrically connected to chip carriers 110 and 110A.

Figure 2A:
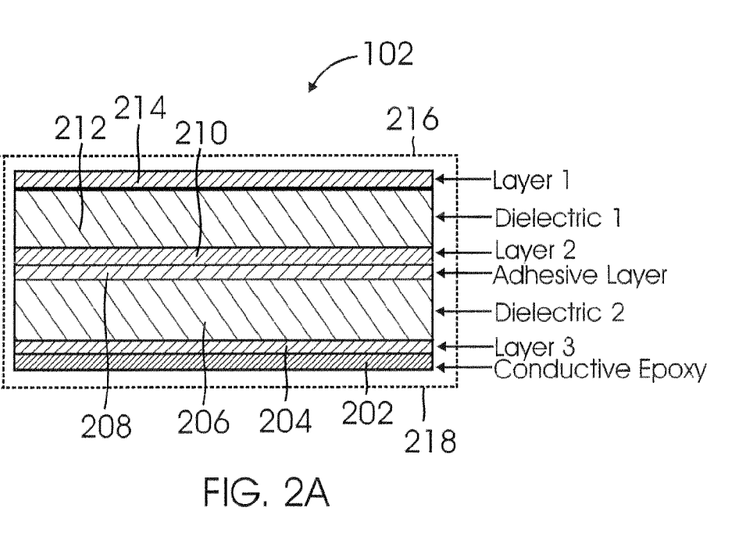
FIGS. 2A and 2B shows a stackup of a multi-layer flex, in accordance with an embodiment of the present invention.
Figure 2B:
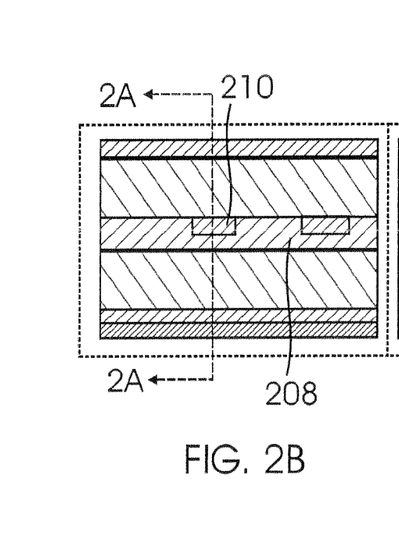

In one embodiment, bent flex circuit 102 may be delivered in an unbent form, having the stack-up shown in FIG. 2. Flex circuit 102 includes a conductive paste epoxy 202 (hereinafter "epoxy 202") used to form a base of flex circuit 102, and used to contact mandrel 104 (FIG. 1). Epoxy 202 is cured into a semi-solid state referred to as "b-stage".

Stacked on epoxy 202 is first metal layer 204, first dielectric layer 206, prepreg layer 208, second metal layer 210, second dielectric layer 212, and third metal layer 214. The metal layers may include any suitable metal material, such as copper.

Figure 3:
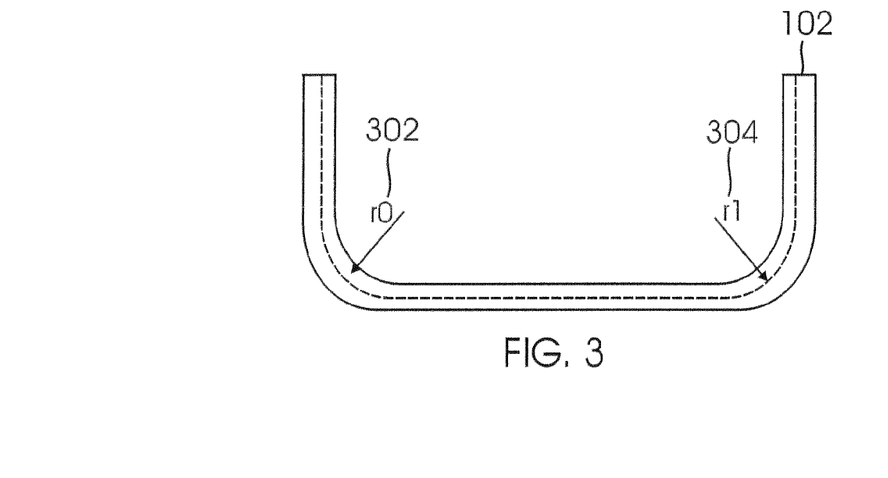
FIG. 3 shows a bending geometry of the multi-layer flex of FIGS. 2A and 2B in accordance with an embodiment of the present invention.

In one embodiment, flex circuit 102 may be formed to a bending profile, as shown in FIG. 3, where r0 302 and r1 304 are the internal bend radii. In this embodiment, flex circuit 102 is aligned and clamped to mandrel 104. Mandrel 104 with flex circuit 102 are then inserted into a forming tool (not shown). In one embodiment, the forming tool has spring-loaded rollers that gently bend flex circuit 102 conforming it to the shape of mandrel 104. Additional clamps are placed on the outside of the bent flex circuit 102 and the assembly is placed in an oven to finish curing b-stage epoxy 202. Bent flex circuit 102 is attached to mandrel 104, which provides the mechanical structure for module 100 (FIG. 1).

In one embodiment, the internal bend radius of flex circuit 102 may be between about 0.040 and 0.060 inches to accommodate half-lambda (λ/2) element spacing, where λ is the wavelength of the antenna frequency. For example, the λ/2 element spacing dictates a module spacing that in turn dictates a bend radius of about 0.050 inches at 30 GHz. The bend radius is scaleable with the inverse of antenna frequency. However, in practice the larger, lower frequency antennas have additional requirements for multi-beam capability that require more space for interconnects. As a result, the internal bend radius required to meet operational objectives has remained relatively constant over a frequency range of 8 GHz to 30 GHz. In the current example, 0.056 inches is satisfactory.

The thickness of flex circuit 102 may be determined by the spacing required between the outer ground planes; which is in turn determined by the dielectric constant of the substrate, the width of the internal transmission lines, and the desired characteristic impedance of the transmission lines. In one embodiment, practical limits on these parameters dictate that flex circuit 102 be about 0.013 inches thick, excluding the thickness of the exterior ground planes. The thickness of the exterior ground planes is on the order of 0.001 inches, thus most of the thickness of the flex circuit is due to the spacing between the exterior ground planes.

Figure 4:
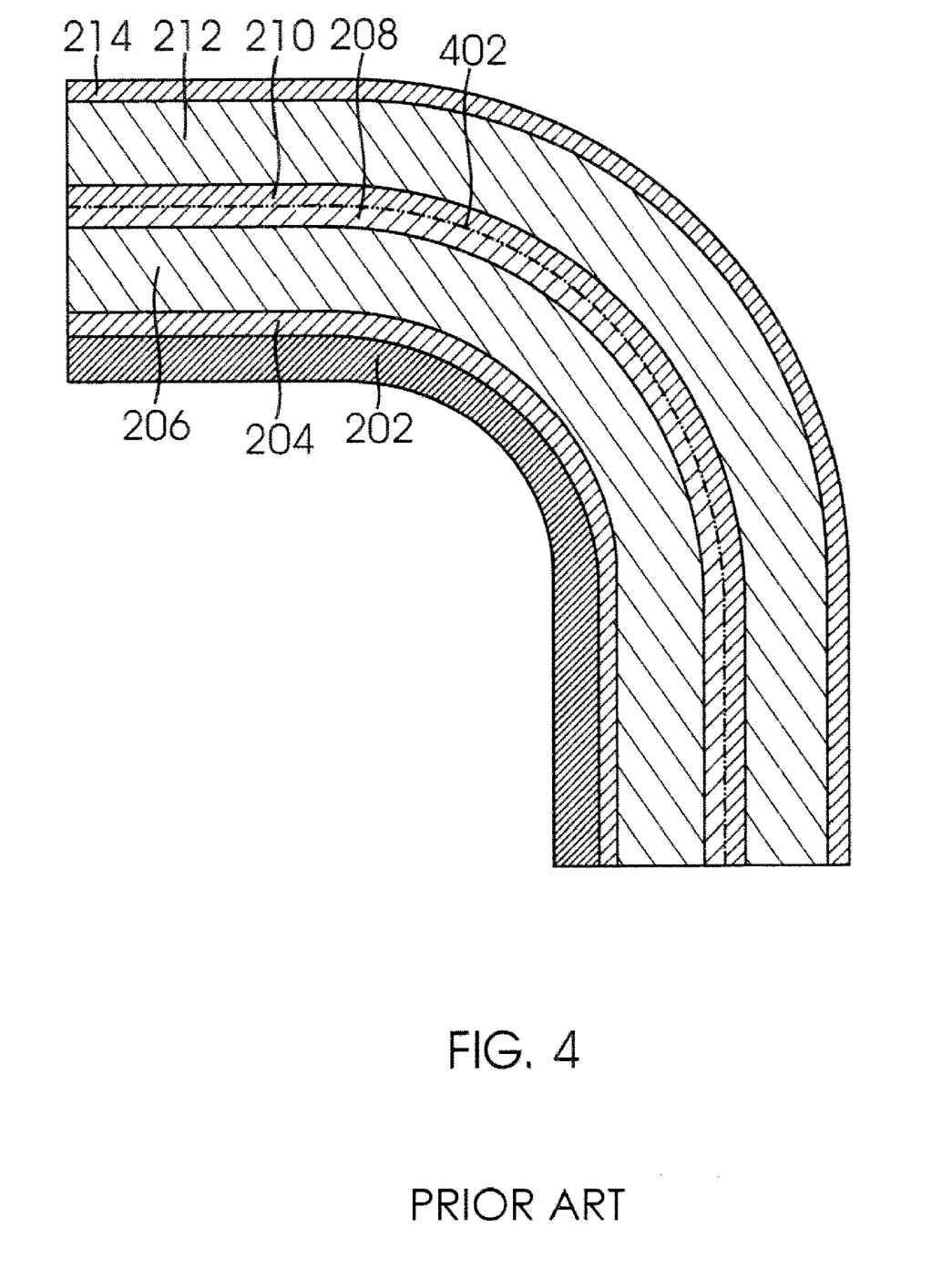
FIG. 4 shows locations of the trouble spots associated with prior art solution.

Historically, problems occur when a flex of the thickness noted above is formed to the previously described internal bend radius. The problems include cracks on the surface, after the flex circuit is formed around mandrel 104. In addition, metal can pull away from the dielectric causing delamination. In addition, buckling of the backside metal can develop. FIG. 4 shows the typical location where these problem areas occur.

The Institute for Interconnecting and Packaging Electronic Circuits maintains IPC-2223 as the design standard for flex circuit construction. Section 5.2.3.4.2 and FIG. 5-7 of the November 1998 edition set limits on the strain the copper can sustain in different situations. This standard also provides means of estimating the minimum bend radius that corresponds to the limiting strain. Table 1 from IPC-2223 lists applicable strain limits for rolled annealed copper and electrodeposited copper. The value for rolled annealed copper is applicable only if rolled annealed copper foil is used, and if no copper is electroplated over the top of the foil. In one embodiment, flex circuit 102 features electrodeposited copper foil with electroplated copper over the top. Thus the smaller strain limit may be applied in this example.

TABLE 1

| Case | Maximum Permissible Strain in Copper when Flex is Formed into Place |
|---|---|
| Rolled annealed copper | ≦16% |
| Electrodeposited copper | ≦11% |

TABLE 2

| Case | Internal Bend Radius (inches) | Effective Substrate Thickness (inches) | Ground Plane Thickness (inches) | Resulting Minimum Internal Bend Radius for 11% Strain Limit and No Cover Layers (inches) |
|---|---|---|---|---|
| Prior Art | 0.056 | 0.013 | .002 | 0.069 |
| Invention | 0.056 | 0.005 | .002 | 0.036 |

Table 2 shows the geometric parameters of the prior art. The computed minimum bend radius of 0.069 inches is greater than the previously described example of 0.040 to 0.060 inch range. Thus, theory agrees with experiment that the flex should crack under the design parameters of the prior art.

Figure 5A:
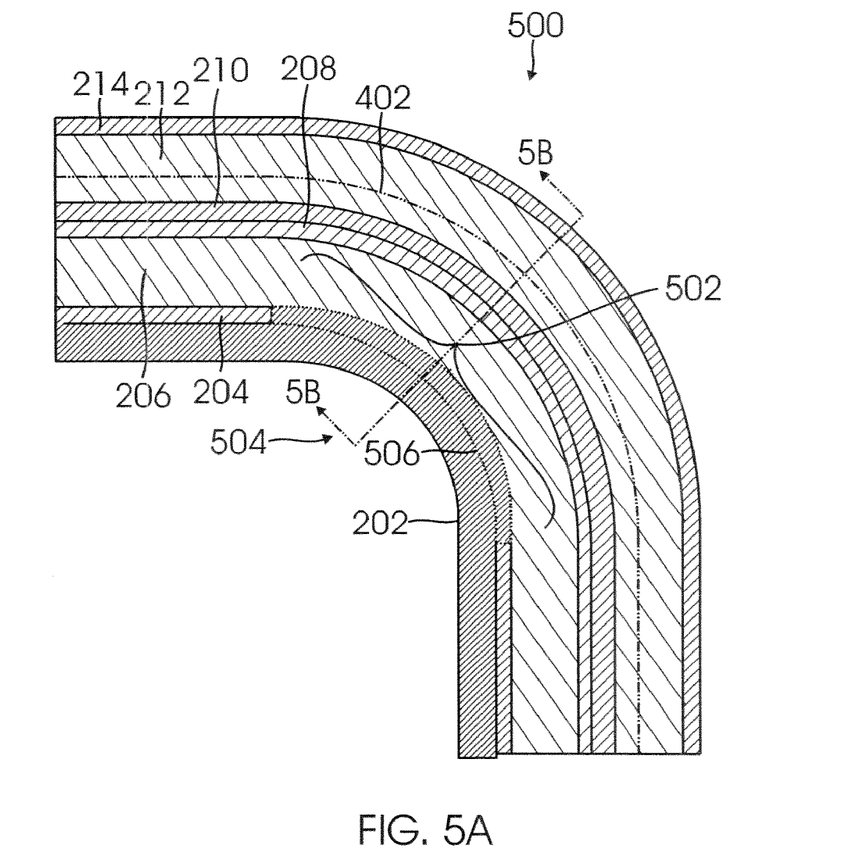
FIG. 5A shows a side view of a bent flex circuit in accordance with an embodiment of the present invention.
Figure 5B:
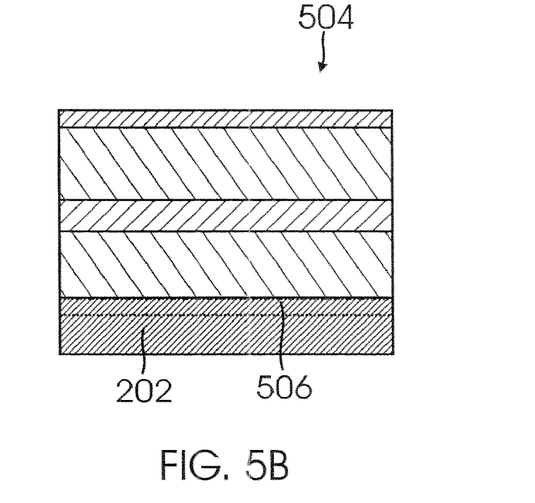
FIG. 5B shows a front view of the bent flex circuit (having a stripline configuration) of FIG. 5A in accordance with an embodiment of the present invention.

FIGS. 5A and 5B illustrate a stackup 500 in accordance with the present invention. Stackup 500 at bend region 504 includes outside metal layer 214 and intermediate metal layer 210; first dielectric layer 212 interposed between outside metal layer 214 and intermediate metal layer 210 and second dielectric layer 206 interposed between intermediate metal layer 210 and inside metal layer 204 all stacked upon epoxy layer 202. In one embodiment, inside metal layer 204 is a stripline ground-plane.

In one embodiment, a portion 502 of inside metal layer 204 in bend region 504 is etched away. The area corresponding to portion 502 of metal layer 204 thus removed, is then re-filled with conductive epoxy 506.

Figure 6A:
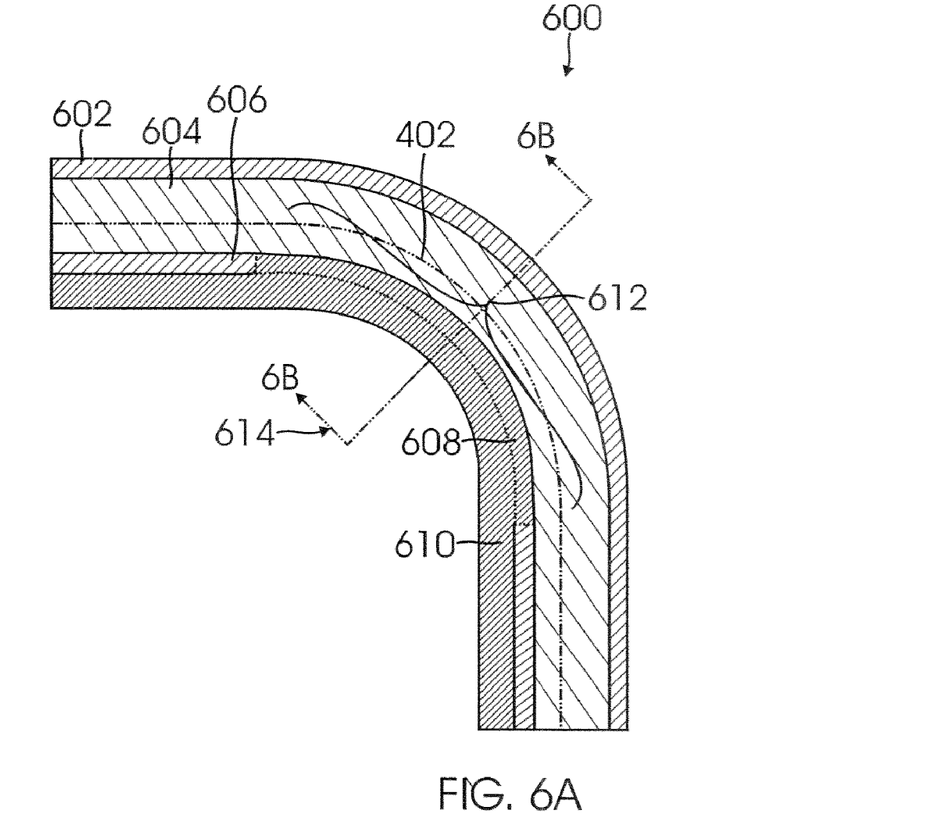
FIG. 6A shows a side view of a bent flex circuit in accordance with another embodiment of the present invention.
Figure 6B:
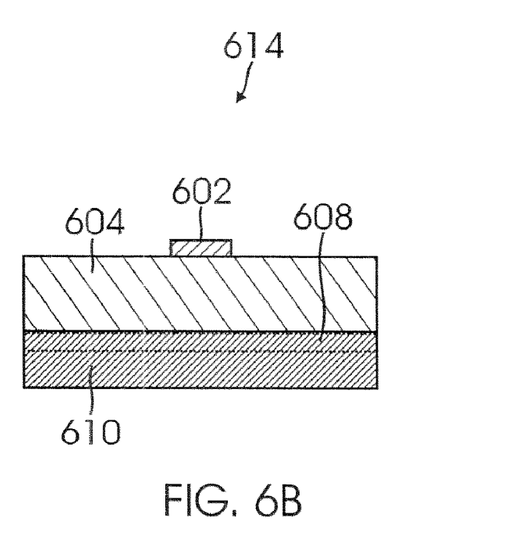
FIG. 6B shows a front view of the bent flex circuit (having a microstrip configuration) of FIG. 6A in accordance with an embodiment of the present invention.

FIGS. 6A and 6B illustrate a stackup 600 in accordance with the present invention. Stackup 600 at bend region 614 includes outside metal layer 602 and second metal layer 606; dielectric layer 604 interposed between metal layer 602 and metal layer 606 metal layer 606 stacked upon epoxy layer 610. In this embodiment, metal layer 606 is a microstrip ground-plane. In this embodiment, a portion 612 of metal layer 606 in bend region 608 is etched away. The area corresponding to portion 612 of metal layer 606 thus removed, is then re-filled with conductive epoxy 608.

Figure 9:
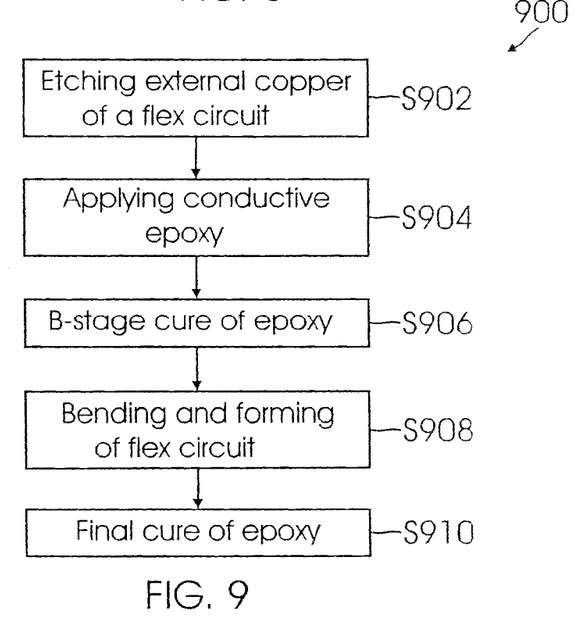
FIG. 9 is a flowchart showing a method of producing a flex circuit in accordance with an embodiment of the present invention.

FIG. 9 is a flowchart illustrating a method 900 of forming a bent flex circuit 102 in accordance with the present invention.

Referring now to FIGS. 5A, 6A and 9, in operation, a circuit 102 is formed including at least an outside metal layer 214 or 602 and an inside metal layer 204 or 606, such as copper metal layers. In step S902 a portion of inside metal layer 204 or 606 is removed, such as by etching metal layer 204 or 606, from bend region 504 or 614. After portion 502 or 612 has been removed, in step S904 a deposition process is used to re-fill bend region 504 or 614, without using copper, to restore the electrical continuity of metal layer 204 or 606. In one embodiment, the fill material is a conductive epoxy, like Epoxy Technologies EE149-6.

At step S906, the fill material is subjected to B-stage curing.

Thereafter, in step S908, flex circuit 102 may be formed around mandrel 104 to create the desired bend radius. The "bent" flex circuit 102 may then be cured to cause epoxy 202 or 610 to become structural and conductive. Beneficially, epoxy 202 or 610 can be selected to duplicate the electrical functions of the portion 502 or 612 of metal layer 204 or 606 that was removed. Although, epoxy 202 or 610 was previously present, it was used to bond the copper ground plane to mandrel 104, and was not a direct part of the RF transmission structure.

This approach is advantageous because the copper is a much stiffer material than either the dielectric materials or the b-stage epoxy during both elastic and plastic deformation. The difference is so pronounced that the mechanical characteristics of flex circuit 102 are almost entirely determined by the copper metal layer.

Referring to FIGS. 4, 5A and 5B, when portion 502 is removed from metal layer 204, the neutral axis 402 shifts from the center of stackup 500 (see FIG. 4) to somewhere between the two remaining metal layers, the intermediate metal layer 210 and the outer metal layer 214 as shown in FIG. 5A. Mechanically, flex circuit 102 bends almost as if it included only copper layers of the intermediate metal layer 210 and the outer metal layer 214, and first dielectric layer 212, even though prepreg layer 208 and second dielectric layer 206 are still present. The effective thickness of stackup 500 can be viewed as the combined thicknesses of first dielectric layer 212 and copper layers of the outer metal layer 214 and the intermediate metal layer 210, which in one embodiment is about 0.009 inches. As demonstrated in Table 2, when the pertinent parameters are applied to the IPC model, the resulting minimum bend radius becomes about 0.036 inches.

Figure 7:
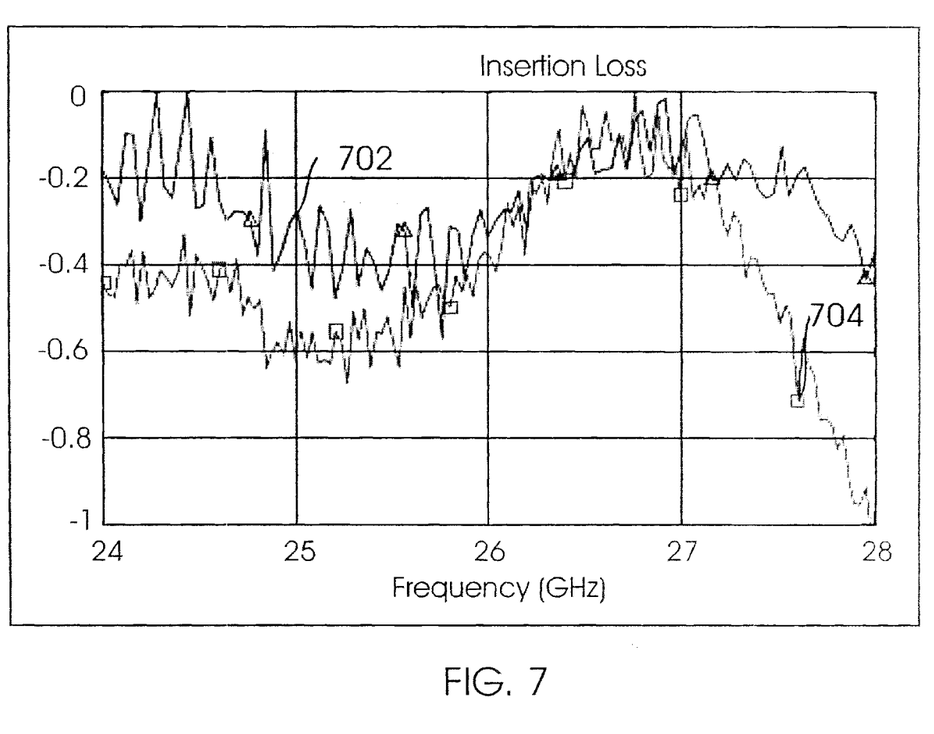
FIG. 7 shows a plot of an insertion loss captured on a network analyzer in accordance with an embodiment of the present invention.
Figure 8:
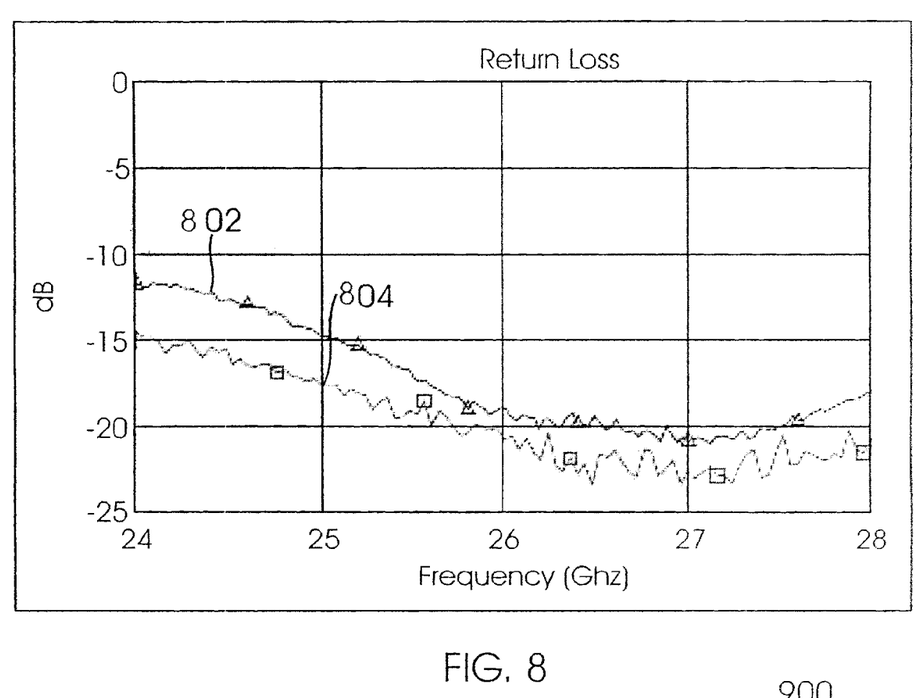
FIG. 8 shows a plot of a return loss captured on a network analyzer in accordance with an embodiment of the present invention.

A series of electrical measurements were performed on representative flex circuits, before and after the inside metal layer was removed. FIGS. 7 and 8 show the results of these measurements. Traces 702 and 802 are the insertion and return loss signals, respectively, as measured on a typical flex circuit, Traces 704 and 804 are the insertion and return loss signals, respectively, as measured on a modified flex circuit 102 with the copper removed in accordance with the present invention. In the intended environment, the removed copper that forms part of the stripline ground-plane is replaced by the b-stage epoxy. However, for the purpose of verification, the parts were tested with no epoxy added; this condition represents the worst-case condition. The measurements demonstrated there is significant change to the electrical performance.

Implementation of this invention allows flex circuit 102 to be formed to a tighter bend radii than would otherwise be possible, and allows the use of a broader range of materials, such as the use of electrodeposited copper rather than rolled annealed copper.

In an alternate embodiment, the flex circuit is a microstrip construction. The microstrip construction may include a single layer of dielectric with conductors laminated to either side. The conductor on one side is etched into one or more conducting traces, while the copper on the other side is a monolithic ground plane. The procedure previously described is equally applicable to the microstrip construction when the epoxy substitution approach is applied to the ground plane side of the flex circuit.

Although the present invention has been described with reference to specific embodiments, these embodiments are illustrative only and not limiting. Many other applications and embodiments of the present invention will be apparent in light of this disclosure and the following claims.

What is claimed is:

1. A method for forming a conformable circuit element, the method comprising:
   depositing a conductive layer on a first side of a flex circuit;
   etching said conductive layer to form an etched region, wherein the etched region breaks electrical continuity of the conductive layer;
   depositing a conductive epoxy on the etched region, wherein the conductive epoxy restores the electrical continuity of the conductive layer;
   bending the flex circuit in the etched region to form a concave surface on the first side; and
   curing the conductive epoxy.

2. The method of claim 1, wherein curing the conductive epoxy comprises curing the conductive epoxy until the conductive epoxy becomes structural and conductive.

3. The method of claim 1, wherein the conductive epoxy is cured into a B-stage state prior to bending the flex circuit.

4. The method of claim 1, wherein the size of the etched region is determined as a function of a bending radius.

\* \* \* \* \*